United States Patent [19]

Egitto et al.

[11] Patent Number: 4,985,112

[45] Date of Patent: Jan. 15, 1991

[54] ENHANCED PLASMA ETCHING

[75] Inventors: Frank D. Egitto, Binghamton; Walter E. Mlynko, Vestal, both of N.Y.

[73] Assignee: International Business Machines Corporation, Armonk, N.Y.

[21] Appl. No.: 12,696

[22] Filed: Feb. 9, 1987

[51] Int. Cl.⁵ .............................................. H01L 21/00
[52] U.S. Cl. ..................................... 156/643; 156/646; 156/668
[58] Field of Search ............................... 156/643, 646

[56] References Cited

U.S. PATENT DOCUMENTS

| | | |
|---|---|---|
| 3,677,799 | 7/1972 | Hou . |
| 4,263,088 | 4/1981 | Gorin . |
| 4,357,195 | 11/1982 | Gorin . |
| 4,357,203 | 11/1982 | Zelez . |
| 4,401,507 | 8/1983 | Engle . |
| 4,500,563 | 11/1985 | Ellenberger et al. . |
| 4,568,563 | 2/1986 | Jackson et al. ...................... 427/40 |
| 4,579,618 | 4/1986 | Celestino et al. .................. 156/646 |
| 4,585,516 | 4/1986 | Corn et al. ........................... 156/646 |
| 4,602,981 | 7/1986 | Chen et al. .......................... 156/646 |
| 4,609,428 | 9/1986 | Fujimura ............................. 156/646 |
| 4,617,079 | 10/1986 | Tracy et al. ........................ 156/646 |
| 4,626,315 | 12/1986 | Kitamoto et al. ................... 156/646 |

FOREIGN PATENT DOCUMENTS

| | | |
|---|---|---|
| 0203560 | 12/1986 | European Pat. Off. . |
| 0223721 | 5/1987 | European Pat. Off. . |
| 2105729 | 3/1983 | United Kingdom . |

OTHER PUBLICATIONS

Boswell, et al., Applied Physics Letters, "Pulsed High Rate Plasma Etching With Variable Si/SiO₂ Selectivity and Variable Si Etch Profiles", 47 (1985) Nov., No. 1o.

*Primary Examiner*—David A. Simmons
*Assistant Examiner*—Thi Dang
*Attorney, Agent, or Firm*—Pollock, Vande Sande & Priddy

[57] ABSTRACT

Increased etching rates are obtained by plasma etching wherein the power is applied in a cyclical or oscillating mode.

9 Claims, 1 Drawing Sheet

ENHANCED PLASMA ETCHING

TECHNICAL FIELD

The present invention is concerned with a method for etching and is particularly concerned with a plasma etching method.

In particular, the present invention is concerned with a plasma etching process that exhibits an enhanced or increased etching rate. The plasma etching process of the present invention is especially useful in fabrication processes in the electronics industry such as involved in packaging of integrated circuit chips.

BACKGROUND ART

In the fabrication of integrated circuits, a number of the steps involved, for instance, in preparing integrated circuit chips and the packaging for the chips (articles to which the chips are attached and protected), are etching processes. Accordingly, over the years, a number of vastly different types of etching processes to remove material, sometimes in selective areas, have been developed and are utilized to varying degrees. One such etching process is referred to as "plasma etching". This type of etching procedure generally involves filling a container such as a bell jar with a gas whose dissociative fragments are chemically reactive. An example of such a gas is $CF_4$. The surface that is to be etched is introduced into the container, along with the reactive gas. In the event the surface to be etched is to be etched only in certain predetermined areas, such surface would previously be covered by a mask to prevent etching in the areas not to be etched. The feed gas is usually dissociated, forming positive and negative ions, electrons, and reactive neutrals by coupling radio frequency power to the plasma by a capacitive or inductive coupling. It is believed that the reactive fragments then chemically interact with the surface to be etched. In such a process, the substrates may be positioned either on a ground plane on the rf driven electrode (cathode) or on an electrically insulated carrier.

Plasma etching has been used to a significant extend, depending upon the particular reactive gas employed for etching both organic and inorganic materials. Such materials include polyimides, polyepoxides, photoresists, and silicon.

For instance, polyimides are used to a large extent as insulation between two layers of metallization in multilevel metallization articles such as metallized ceramics. In such articles, two layers of metal, such as aluminum, an aluminum alloy, or copper are separated by a layer of insulating dielectric material such as a polyimide that contains vias in a predetermined pattern. The vias in the polyimide dielectric layers are formed by plasma etching. The gas employed, whose dissociative fragments are chemically reactive for etching polyimides include $CF_4$ and oxygen, and mixtures thereof.

SUMMARY OF INVENTION

The present invention is concerned with a method of etching an article by plasma etching whereby the etching rate is significantly increased. In particular, the method of the present invention includes positioning the article to be etched on a cathode and enclosing the cathode and the article to be etched in a chamber. An etchant gas is introduced into the chamber and power is applied to the cathode in an oscillating mode to thereby enhance the etching rate. It has been found in accordance with the present invention that the etching rate achieved by employing an oscillating mode for the power is significantly higher than the rate obtained at any power at or between the limits of the power oscillations employed.

BEST AND VARIOUS MODES FOR CARRYING OUT INVENTION

Figure 1:
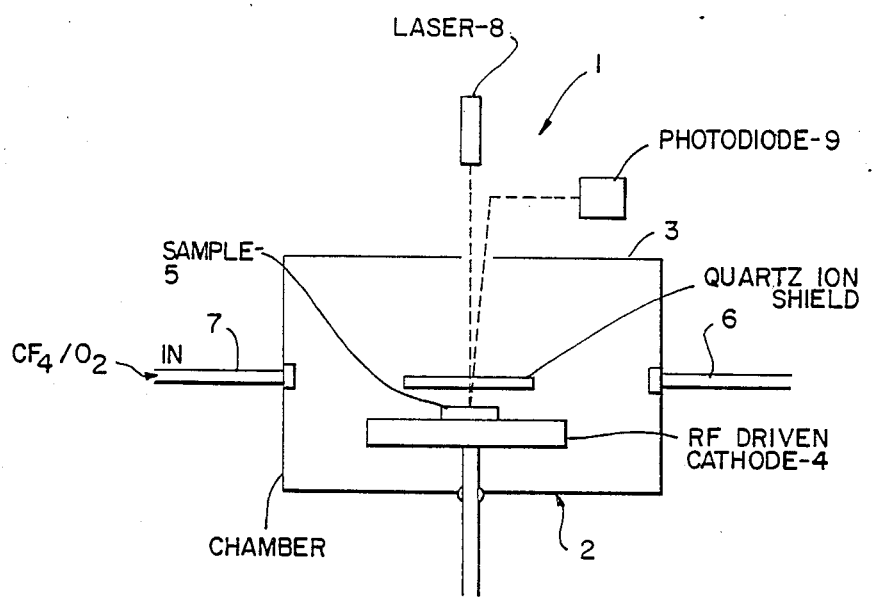
FIG. 1 is a schematic diagram of apparatus that can be used to carry out the process of the present invention.

FIG. 1 depicts diagramatically an apparatus suitable for carrying out the process of the present invention.

In FIG. 1 there is illustrated a vacuum envelope 1 that includes a base plate (2) and bell jar (3), such as a glass or metal bell jar that is hermetically sealed to the base plate (2). The volume of (1) vacuum envelope employed in the present invention typically is about 50 liters. Within the vacuum envelope (1) is a cathode (4).

The cathode is an electrode that is preferably driven by a radio frequency power source (not shown). However, the cathode can employ power sources at other frequencies.

The cathode (4) is usually copper and, if desired, can be provided with a conduit for providing coolant to maintain the temperature of the cathode sufficiently low so as not to endanger degradation of the article being etched. Other metals for the cathode include aluminum and stainless steel.

The article to be etched is placed atop the cathode.

The vacuum envelope includes an exhaust means (6) for evacuating the space enclosed in the vacuum envelope and is connected to a pumping means (not shown). The envelope can thereby be evacuated prior to subjecting the articles to the process of the present invention. The envelope also includes a conduit 7 for introducing the feed gas into the vacuum envelope.

In addition, it may be desirable to include an ion shield such as quartz shield (10) in order to separate the article being etched from bombardment by energetic ions from the plasma while allowing attack of the article (6) to be etched by reactive neutrals.

Also provided in order to monitor the etch rate is a laser interferometer system, such as one having a laser (8) operating at a wavelength of about 6328 angstroms, and a photodiode detector (9). The combination of laser (8) and photodiode (9) is referred to as a Laser Interferometer.

The articles to be etched in accordance with the present invention include a substrate and the surface thereon that is to be etched. Such substrates can include inorganic materials such as silicon and silicon oxide and organic materials including thermoplastic and thermosetting polymers.

Examples of some organic materials are polyimides, polyamides, epoxy resins, phenolic-aldehyde polymers, polyolefins such as polypropylene and polyethylene, and the various known photoresist materials.

A typical photoresist material is one based on phenol formaldehyde novolak polymers. Particular examples being Shipley 1350 which is an m-cresol formaldehyde novolak polymer composition. Such is a positive resist and includes therein a diazoketone such as 2-diazo-1-naphthol-5-sulphonic acid ester.

A discussion of photoresist materials can be found, for instance, in Journal of the Electrochemical Society, Volume 125, No. 3, March 1980, Deckert, et al., "Microlithography—Key to Solid-State Fabrication", pp. 45C–56C, disclosure of which is incorporated herein by reference. Of course, the reactive gas to employ in any particular process will depend upon the particular material being etched.

The preferred materials to be etched in accordance with the present invention are the polyimides. When the process is used in preparing patterned articles, a mask, for instance, of a photoresist or electron beam resist material is applied on top of the surfaces to be etched.

The etchant gas employed will depend upon the particular material being etched and such are well-known in the art. For instance, when a polyimide is being etched, the etchant gas generally includes a gaseous fluorocarbon capable of supplying fluorine. Examples of such gases are $CF_4$, $CHF_3$, and $C_2F_6$. The fluorocarbons also supply $CF_3+$ ions. Also for polyimides, oxygen is a well-known etchant gas. Mixtures of oxygen and a gaseous fluorocarbon can be employed if desired. The preferred etchant includes a mixture of about 1 to about 50 parts by volume of the fluorocarbon and about 99 to about 50 parts by volume of oxygen, and more preferably about 10 to about 40 parts by volume of the fluorocarbon and about 90 to about 60 parts by volume of the oxygen.

It is essential in accordance with the present invention that the power applied to the cathode be cycled or oscillated in order to achieve the enhanced etching rate obtained by the present invention. The frequency of the cycling or oscillation is related directly to the residence time of the reactive gas in the chamber. In other words, the faster the gas moves through the chamber, the quicker the frequency of the oscillation must be in order to go from one limit to the other limit of the power cycle while the gas is still in the reaction chamber in order to achieve the most beneficial effects of the present invention. For best results, the power is in a pulsed or cyclic mode during the predominant part of the etching and most preferably during substantially all of the etching procedure. In a typical arrangement wherein the chamber size is about 1½ feet in diameter and about 10 inches in height, the power is cycled from about 50 watts to about 500 watts and back again. The gas flow rate is generally such that the gas flows through the chamber in about 1 to about 30 seconds. The gas flow rate is generally about 10 to about 200 standard cubic centimeters per minute, a typical value being about 100 standard cubic centimeters per minute. The pressure in the chamber is generally about 1 to about 500 millitorr, typical value being about 100 millitorr.

The temperature of the cathode is generally maintained at about room temperature to about 100° C. during the etching process.

The following non-limiting Example is presented to further illustrate the present invention:

EXAMPLE

A silicon wafer having a diameter of about 3¼ inches is coated with a solution of polyamic acid by spin-coating. The film is dried and cured by subjecting the film to elevated temperatures. In particular, the temperature is raised from about room temperature to about 360° C. in about 1 hour, held there for about 0.5 hours, and then cooled down to about room temperature in about 1 hour. The thickness of the coating after curing is about 10 microns.

The coated substrate is then placed in a vacuum chamber of the type illustrated in FIG. 1 and subjected to a radio frequency power oscillated between about 50 watts to 500 watts with a period of about 2 seconds during exposure to a mixture of $CF_4$ and oxygen in a ratio of about 1 to about 4. The gas flow rate employed is about 100 standard cubic centimeters per minute and the pressure in the vacuum chamber is about 100 millitorr. The chamber employed is about 1½ feet in diameter.

The etch rate for the polyimide is about 1400 angstroms per minute as compared to only 800 angstroms per minute when employing a radio frequency power of about 50 and about 900 angstroms per minute when employing a radio frequency power of about 500 watts.

Having thus described our invention, what we claim as new and desire to secure by Letters Patent is:

1. A method for etching an article by plasma etching wherein said article includes a substrate and a surface of organic material selected from the group of polyimides, polyamides, epoxy resins, phenolic-aldehyde polymers, and polyolefins thereon which comprises:
    positioning the article to be etched on a cathode;
    enclosing in a container the cathode and the article to be etched;
    introducing an etchant gas into said container wherein said etchant gas is a mixture of a fluorocarbon and oxygen; and
    applying power to the cathode in an oscillating mode to thereby enhance the etching rate, wherein the power is cycled between about 500 watts and about 50 watts.

2. The method of claim 1 wherein said surface comprises a polyimide.

3. The method of claim 1 wherein said gas includes $CF_4$.

4. The method of claim 1 wherein the power is radio frequency power.

5. The method of claim 1 wherein the flow of gas is about 10 to about 200 standard cubic centimeters per minute.

6. The method of claim 1 wherein the pressure during the etching is about 1 to about 500 millitorr.

7. The method of claim 1 wherein said gas is a mixture of about 1 to about 50 parts by volume of said fluorocarbon and about 99 to about 50 parts by volume of oxygen.

8. The method of claim 1 wherein said gas is a mixture of about 10 to about 40 parts by volume of a fluorocarbon and about 90 to about 60 parts by volume of oxygen.

9. The method of claim 1 wherein said fluorocarbon is selected from the group of $CHF_3$, $CF_4$, and $C_2F_6$.

* * * * *